(12) United States Patent
Jeong et al.

(10) Patent No.: US 11,901,322 B2
(45) Date of Patent: Feb. 13, 2024

(54) FABRICATION METHOD OF SEMICONDUCTOR DIE AND CHIP-ON-PLASTIC PACKAGING OF SEMICONDUCTOR DIE

(71) Applicant: MagnaChip Semiconductor, Ltd., Cheongju-si (KR)

(72) Inventors: Jin Won Jeong, Seoul (KR); Jae Sik Choi, Cheongju-si (KR); Byeung Soo Song, Sejong-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 17/747,124

(22) Filed: May 18, 2022

(65) Prior Publication Data

US 2022/0278064 A1 Sep. 1, 2022

Related U.S. Application Data

(62) Division of application No. 16/934,338, filed on Jul. 21, 2020, now Pat. No. 11,380,640.

(30) Foreign Application Priority Data

Mar. 19, 2020 (KR) ........................ 10-2020-0033842

(51) Int. Cl.
*H10K 77/10* (2023.01)
*H01L 23/31* (2006.01)
(Continued)

(52) U.S. Cl.
CPC ............ *H01L 24/11* (2013.01); *H01L 21/268* (2013.01); *H01L 21/3043* (2013.01); *H01L 21/3065* (2013.01); *H01L 21/78* (2013.01); *H01L 24/03* (2013.01); *H01L 24/04* (2013.01); *H01L 24/13* (2013.01); *H01L 24/29* (2013.01); (Continued)

(58) Field of Classification Search
CPC ... H01L 24/11; H01L 21/268; H01L 21/3043; H01L 21/3065; H01L 21/78; H01L 24/03; H01L 24/04; H01L 24/13; H01L 24/29; H01L 24/81; H01L 24/83; H01L 24/91;
(Continued)

(56) References Cited

U.S. PATENT DOCUMENTS 7,682,937 B2   3/2010   Evertsen et al.
10,177,004 B2  1/2019   Watanabe et al.
(Continued)

FOREIGN PATENT DOCUMENTS

KR   10-2020-0006498 A   1/2020

OTHER PUBLICATIONS

Korean Office Action dated Nov. 29, 2021 in corresponding Korean Patent Application No. 10-2020-0033842 (10 pages In Korean).
Taiwanese Office Action dated Aug. 29, 2023, in counterpart Taiwanese Patent Application No. 109130164 (5 pages in English, 5 pages in Chinese).

*Primary Examiner* — Didarul A Mazumder
(74) *Attorney, Agent, or Firm* — NSIP Law

(57) ABSTRACT

A semiconductor chip packaging method includes forming a bump on a wafer, forming a coating film covering the bump, laser grooving the wafer, plasma etching the wafer on which the laser grooving is performed, exposing the bump by removing the coating film covering the bump, fabricating a semiconductor die by performing mechanical sawing of the wafer, and packaging the semiconductor die.

10 Claims, 11 Drawing Sheets

(51) Int. Cl.
*H01L 23/00* (2006.01)
*H01L 21/3065* (2006.01)
*H01L 21/268* (2006.01)
*H01L 21/304* (2006.01)
*H01L 25/16* (2023.01)
*H01L 21/78* (2006.01)
*H10K 71/00* (2023.01)

(52) U.S. Cl.
CPC .............. *H01L 24/81* (2013.01); *H01L 24/83* (2013.01); *H01L 24/91* (2013.01); *H01L 25/167* (2013.01); *H10K 71/00* (2023.02); *H10K 77/111* (2023.02); *H01L 2224/0401* (2013.01)

(58) Field of Classification Search
CPC ... H01L 25/167; H01L 51/0097; H01L 51/56; H01L 2224/0401; H01L 2224/83851
See application file for complete search history.

(56) References Cited

U.S. PATENT DOCUMENTS

| | | |
|---|---|---|
| 10,340,170 B2 | 7/2019 | Van Lieshout et al. |
| 10,796,962 B2 | 10/2020 | Wakahara et al. |
| 2011/0318934 A1 | 12/2011 | Wada et al. |
| 2012/0322202 A1 | 12/2012 | Nishimura et al. |
| 2013/0341800 A1* | 12/2013 | Tu ............................ H01L 24/15 |
| | | 257/774 |
| 2015/0206934 A1* | 7/2015 | Funaya .................... H01L 24/06 |
| | | 438/3 |
| 2015/0243547 A1 | 8/2015 | Fang et al. |
| 2016/0172243 A1 | 6/2016 | Moeller et al. |
| 2019/0103532 A1* | 4/2019 | Lee ......................... H01L 24/75 |
| 2019/0157100 A1 | 5/2019 | Harikai et al. |
| 2019/0304838 A1 | 10/2019 | Saeki et al. |
| 2019/0371668 A1 | 12/2019 | Karasaki et al. |
| 2020/0020585 A1 | 1/2020 | Wakahara et al. |

* cited by examiner

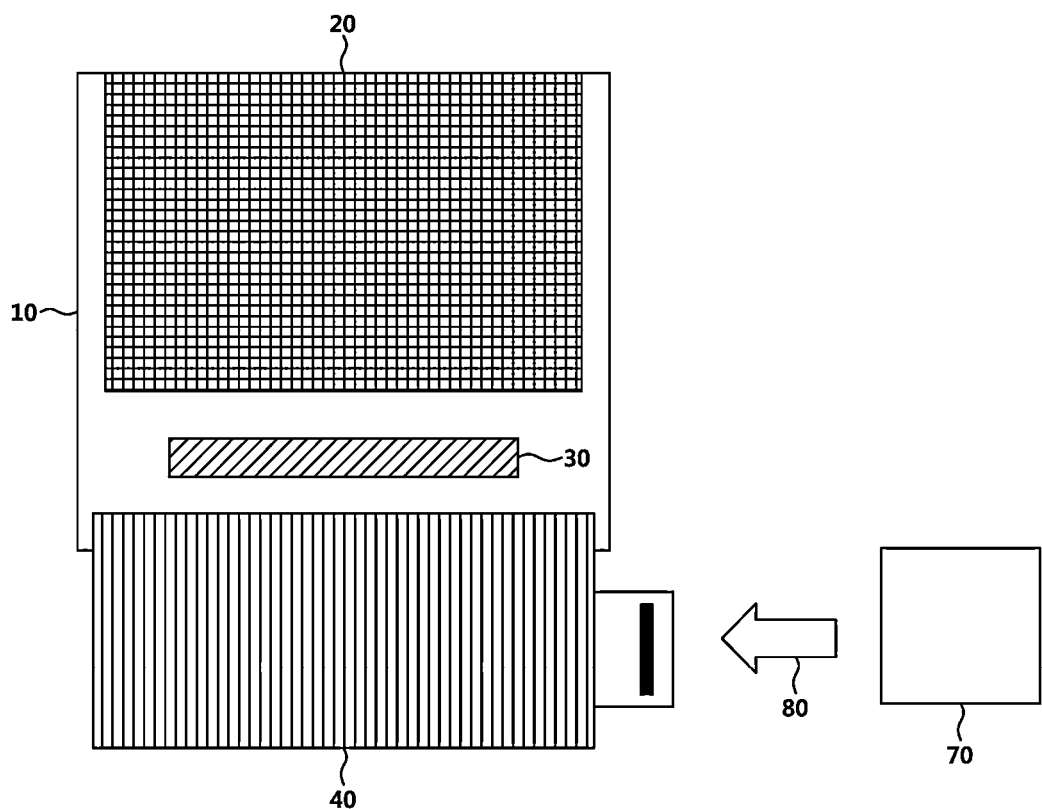

FABRICATION METHOD OF SEMICONDUCTOR DIE AND CHIP-ON-PLASTIC PACKAGING OF SEMICONDUCTOR DIE

CROSS-REFERENCE TO RELATED APPLICATIONS

This is a divisional application of U.S. patent application Ser. No. 16/934,338 filed on Jul. 21, 2020 which claims the benefit under 35 U.S.C. 119(a) of Korean Patent Application No. 10-2020-0033842 filed on Mar. 19, 2020 in the Korean Intellectual Property Office, the entire disclosure of which is incorporated herein by reference for all purposes.

BACKGROUND

1. Field

The following description relates to a fabrication method of a semiconductor die and a chip-on-plastic packaging. The following description also relates to a fabrication method of a semiconductor die by laser cutting and plasma etching, and a method for chip-on-plastic packaging of such a semiconductor die.

2. Description of Related Art

In order to form individual semiconductor dies, mechanical sawing or mechanical dicing may be generally used. A typical example of such an approach may be sawing or dicing using a diamond blade. However, as the chip size becomes smaller and a low dielectric constant film may be used for the semiconductor device, various problems may emerge from using such a diamond blade sawing process. In such a sawing process, defects such as cracking may be caused. Accordingly, the low dielectric constant film may be very vulnerable to cracking.

Therefore, recently, a grooving process using a laser may be used together with a mechanical sawing process. However, residues having various conductivity may be formed on a silicon substrate as a result of using the laser grooving process. That is, a significant amount of conductive residues, such as silicon debris or a grooving burr, may be generated by such a laser grooving. Undesired shorting problems may be caused due to the formation of these conductive residues. That is, undesired shorting problems may be caused between a substrate of a display panel and a display driver chip, due to the conductive residues in a chip-on-plastic package in which a semiconductor die such as a display driver chip, is attached directly onto a substrate of a display panel.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor chip packaging method includes forming a bump on a wafer, forming a coating film covering the bump, laser grooving the wafer, plasma etching the wafer on which the laser grooving is performed, exposing the bump by removing the coating film covering the bump, fabricating a semiconductor die by performing mechanical sawing of the wafer, and -packaging the semiconductor die.

The packaging the semiconductor die may include preparing a flexible substrate comprising a bonding pad, attaching an anisotropic conductive film (ACF) comprising conductive balls to the flexible substrate, and attaching the bump and the bonding pad of the flexible substrate to each other by using the conductive balls.

The method may further include preparing a semiconductor substrate comprising a semiconductor die region, a seal-ring region and a test region on the wafer, and forming an interlayer insulating film, a metal wiring, a metal pad, and a passivation insulating film on the semiconductor substrate.

The laser grooving the wafer may include exposing a semiconductor substrate of the wafer by removing the interlayer insulating film, using a laser light source.

By performing the laser grooving the wafer and the plasma etching the wafer, the interlayer insulating film in the seal-ring region may have a thickness less than a thickness of the interlayer insulating film in the semiconductor die region.

The plasma etching the wafer may include performing a first plasma etching using oxygen ($O_2$) gas in a plasma state, and performing a second plasma etching using fluorine (F) gas in a plasma state.

The first plasma etching may further use any one of nitrogen ($N_2$), argon (Ar), and helium (He) gases, and the second plasma etching may further use oxygen gas, and the fluorine gas may include any one of carbon tetrafluoride ($CF_4$), sulfur hexafluoride ($SF_6$), octafluorocyclobutane ($C_4F_8$), fluoromethane ($CH_3F$), and nitrogen trifluoride ($NF_3$).

Plasma etching the wafer may be performed under a condition of a pressure of 5 to 700 mTorr and 10 to 10000 W of plasma power.

The packaging the semiconductor die may further include forming an organic light emission display panel on the flexible substrate, wherein the semiconductor die may include a display driving chip, and wherein the packaging may be chip-on plastic packaging (COP).

The laser grooving the wafer may produce a grooving burr and debris, and the plasma etching the wafer may remove the grooving burr and the debris.

In another general aspect, a fabrication method of a semiconductor die includes preparing a semiconductor substrate including a semiconductor die region and a seal-ring region, forming an interlayer insulating film, a metal wiring, and a metal pad on the semiconductor substrate, forming a passivation insulating film on the substrate, patterning the passivation insulating film, forming a metal bump connected to the exposed metal pad, performing a laser grooving process on the interlayer insulating film, and performing a plasma etching process on the grooved interlayer insulating film, wherein a thickness of the interlayer insulating film in the seal-ring region is smaller than a thickness of the interlayer insulating film in the semiconductor die region.

The method may further include forming a coating film covering the metal bump before the performing the laser grooving process, and performing a mechanical sawing process on the semiconductor substrate to fabricate a semiconductor die.

The method may include packaging the semiconductor die, wherein the packaging the semiconductor die may include preparing a flexible substrate comprising a bonding pad, attaching an anisotropic conductive film (ACF) comprising conductive balls to the flexible substrate, and connecting the metal bump of the semiconductor die to the bonding pad through the conductive balls.

The plasma etching process may remove a burr or debris generated by the laser grooving process.

The packaging the semiconductor die may further include forming an organic light emission (OLED) display panel on the flexible substrate, and the packaging of the semiconductor die may be a type of chip-on plastic packaging (COP).

In another general aspect, a semiconductor die includes a semiconductor substrate including a semiconductor die region and a seal-ring region, an interlayer insulating film, a metal wiring, and a metal pad formed on the semiconductor substrate, a passivation insulating film formed on the metal pad, and a metal bump connected to the metal pad, wherein a thickness of the interlayer insulating film in the seal-ring region is smaller than a thickness of the interlayer insulating film in the semiconductor die region.

The semiconductor die may further include an anisotropic conductive film (ACF) including conductive balls formed on the semiconductor die.

The ACF may include a conductive layer and a non-conductive layer, wherein the non-conductive layer may be disposed between the semiconductor die and the conductive layer.

The non-conductive layer in the ACF may be in contact with the passivation insulating film and/or with the interlayer insulating film.

The semiconductor die may further include a flexible substrate attached to the ACF, wherein the flexible substrate may be curved toward the seal-ring region of the semiconductor die.

The flexible substrate may include a bonding pad, and the metal bump may be connected to the bonding pad through the conductive balls in the ACF.

The metal pad may include an aluminum (Al) metal, the passivation insulating film may include a silicon nitride (SiN) film, the metal wiring may include a copper (Cu) metal, and the interlayer insulating film may have a low-dielectric constant of less than 3.

In another general aspect, a semiconductor die includes a semiconductor substrate including a semiconductor die region and a seal-ring region, an interlayer insulating film, a metal wiring, and a metal pad formed on the semiconductor substrate, a passivation insulating film formed on the metal pad, an anisotropic conductive film (ACF) including conductive balls formed on the semiconductor die, and a metal bump connected to the metal pad.

A thickness of the interlayer insulating film in the seal-ring region may be smaller than a thickness of the interlayer insulating film in the semiconductor die region.

The ACF may include a conductive layer and a non-conductive layer, wherein the non-conductive layer may be disposed between the semiconductor die and the conductive layer.

The non-conductive layer in the ACF may be in contact with the passivation insulating film and/or with the interlayer insulating film.

The semiconductor die may further include a flexible substrate attached to the ACF, wherein the flexible substrate may be curved toward the seal-ring region of the semiconductor die.

The flexible substrate may include a bonding pad, and the metal bump may be connected to the bonding pad through the conductive balls in the ACF.

Other features and aspects will be apparent from the following detailed description, the drawings, and the claims.

BRIEF DESCRIPTION OF THE DRAWINGS

FIG. 2 is a plan view of a chip-on-plastic package of FIG. 1A, according to one or more examples.

Figure 1A:
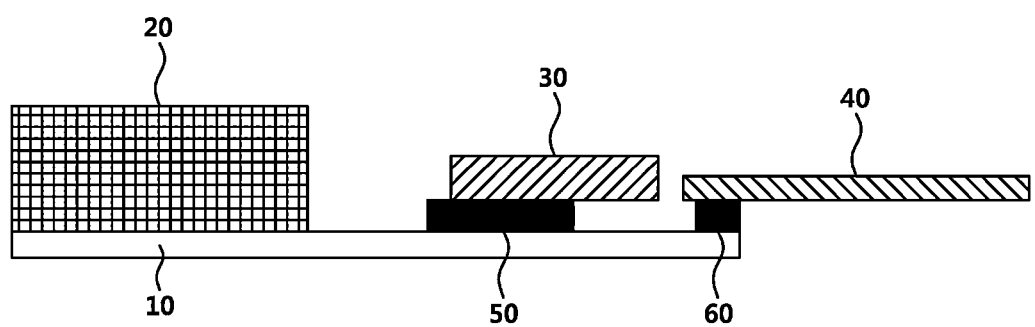
FIGS. 1A and 1B are cross-sectional views of a chip-on-plastic package and a chip-on-film package including a display driving chip, according to one or more examples.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Terms such as "including" or "comprising" used in the embodiments should not be construed as necessarily including all of various components, or various operations described in the specification, and it should be construed that some of the components or some of the operations may not be included or may further include additional components or operations.

The use of the term "may" herein with respect to an example or embodiment (e.g., as to what an example or embodiment may include or implement) means that at least one example or embodiment exists where such a feature is included or implemented, while all examples are not limited thereto.

Objects and effects, and technical configurations for achieving them of the present disclosure will be apparent with reference to the examples described below in detail with the accompanying drawings. In describing the present disclosure, when it is determined that a detailed description of a known function or configuration may unnecessarily obscure the subject matter of the present disclosure, the detailed description thereof will be omitted.

However, the present disclosure is not limited to the examples disclosed below, but may be implemented in various forms. The present examples are merely provided to complete the disclosure of the present disclosure and to fully inform those skilled in the art the scope of the present disclosure, and the present disclosure is defined by the scope of the claims. Therefore, the definition should be made based on the contents throughout the specification.

It may be useful to provide a method of manufacturing a semiconductor die to effectively remove conductive residues, such as silicon debris or a grooving burr, generated by laser grooving. Also, it may be useful to proceed with a chip-on-plastic packaging method after the conductive residues are successfully removed by such a method.

Therefore, the following description may provide a fabrication method of a semiconductor die that may be able to effectively remove conductive residues, such as silicon debris or a grooving burr, that may be generated by laser grooving applied when fabricating a semiconductor die.

More particularly, the following description provides for a fabrication method of a semiconductor die that may be capable of removing conductive residues by performing plasma etching in order to remove the silicon debris or the grooving burrs after the laser grooving process.

The following description also provides for a chip-on-plastic semiconductor packaging method that may be capable of solving an undesired shorting problem that may otherwise occur between a display panel substrate and a driver chip, by removing the conductive residues before attaching the display driver chip to the display panel substrate.

Hereinafter, the present one or more examples are described in greater detail based on the examples illustrated in the drawings.

Figure 1B:
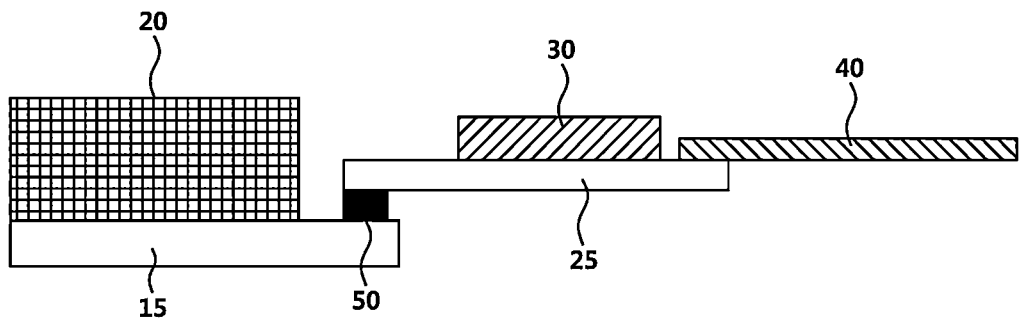

FIG. 1A is a cross-sectional view of a chip-on-plastic package and FIG. 1B is a chip-on-film package including a display driving chip, according to one or more examples.

In the present one or more examples, a display driver IC (DDI) or a display driver chip may be portrayed as a semiconductor die. As a semiconductor die, such a device is not limited to a display driver IC (DDI), and other semiconductor devices may be portrayed.

A DDI package may be largely divided into Chip On Glass (COG), Chip On Film (COF), and Chip On Plastic (COP) technologies, according to whether the substrate to which the display driver IC (DDI) is attached is rigid or flexible. The method of directly attaching a rigid substrate used in a display panel, for example, a rigid glass substrate, may be referred to as COG (Chip On Glass), and a method of applying a flexible film to the display panel may be referred to as COF (Chip On Film). Additionally, the method of attaching DDI to the extended part of the PI using the flexible polyimide (PI) for the display panel itself may be referred to as a COP (Chip On Plastic) approach. Each technology may be commonly applied to small and medium-sized products, or to DDI packages for large products.

As illustrated in FIG. 1A, in a chip-on-plastic package (COP) structure, a display panel 20, a display driving chip or individual semiconductor die 30 and a flexible printed circuit board (FPCB) 40 may be formed on a flexible plastic semiconductor substrate 10, according to a non-limiting example.

A display driver IC (DDI) or a display driving device may be a semiconductor device used to drive each pixel of a display. Such a semiconductor device may generate and control the output signal used for operating a panel, by receiving a signal about which screen to operate from the application process of the device. The driver IC may send signals to each pixel of the panel.

The flexible plastic substrate or the flexible substrate 10 may be formed using a material such as polyimide. A plurality of bonding pads 11 and 12 used for receiving a signal to the display driving chip 30 may be formed on the flexible plastic substrate 10. In addition, the bonding pads of the flexible plastic substrate 10 may be electrically connected to the connector or metal bump 45 of the display driving chip 30, through an anisotropic conductive film (ACF) 50. The connector 45 may refer to a metal connector composed of a bump or a ball. Also, the FPCB 40, similarly, may be connected to the bonding pad of the flexible plastic substrate 10 through an ACF 60. Subsequently, the flexible plastic substrate 10 is referred to as a flexible substrate 10. The display panel 20 may be any one of various display panels including an LCD panel and an OLED panel and other similar panels, as non-limiting examples. A touch sensor or the like may be further disposed on the display panel. The FPCB 40 may serve as an intermediate connector, used for transmitting a signal commanded by an application process (AP) 70 of the display device to the display driving chip 30 in order to drive the display panel 20.

FIG. 1B is a cross-sectional view of a chip-on-film (COF) package. The display panel 20 may be formed on a rigid glass substrate 15. The display driving chip 30 may be formed on a flexible base film 25, and may be connected to the rigid substrate 15 through the ACF 50. The FPCB 40 may be attached and disposed on a flexible base film 25. A plurality of input wiring patterns and a plurality of output wiring patterns may be located on the flexible base film 25. The plurality of input wiring patterns may be electrically connected to the FPCB 40, and the plurality of output wiring patterns may be electrically connected to the display driving chip 30, according to FIG. 1B. The signal input from the FPCB 40 may be transmitted to the display driving chip 30, and the signal may be transferred to a thin film transistor (TFT) of the display panel.

The examples relate to a method of solving various problems that may occur when attaching the display driving chip 30 directly to a flexible substrate using an ACF approach.

FIG. 2 is a plan view of FIG. 1A chip-on-plastic package, according to one or more examples.

It is illustrated in FIG. 2 that the display driving chip 30 may be directly attached to the display panel 20. The display driving chip 30 may be a semiconductor device required to drive each pixel of the display panel 20. The display driving chip 30 may receive signals from the application process (AP) 70 of the device about which screen to operate, and may generate and control output signals for operating the panel. In other words, the driver IC may send signals to each pixel of the panel. The FPCB 40 may serve as an intermediate connector for transmitting the signal 80 that is commanded by the application process (AP) 70 of the display device to the display driving chip 30, in order to drive the display panel 20.

Also, the display driving chip 30 may have a relatively long horizontal length with respect to the vertical length. The display driving chip 30 may be formed to be long enough to effectively drive each pixel of the display panel 20.

Figure 3A:
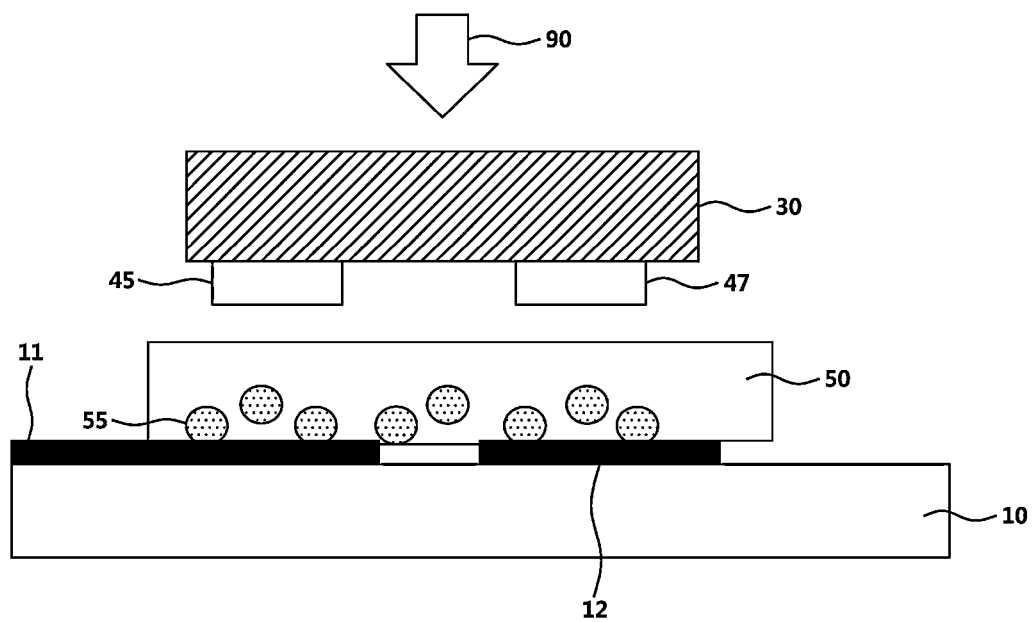
FIGS. 3A and 3B illustrate a process of attaching a display driver chip to a flexible substrate, according to one or more examples.
Figure 3B:
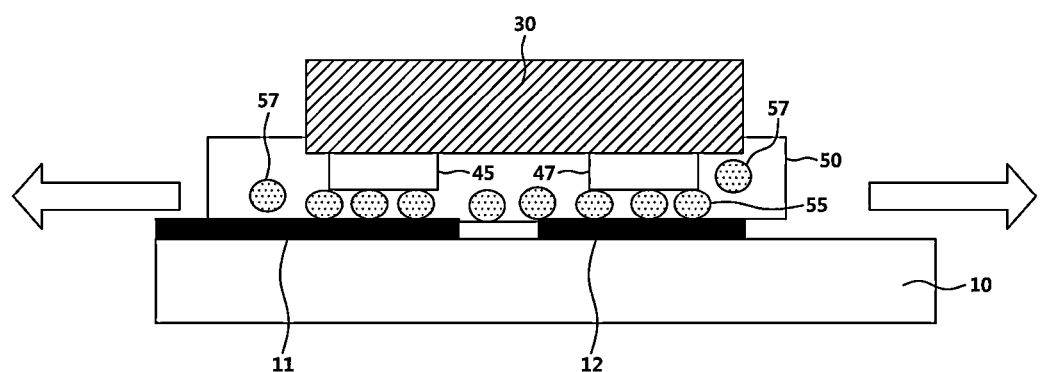

FIGS. 3A and 3B illustrate a process of attaching a display driving chip to a flexible substrate of the display panel, according to one or more examples.

A compressing process 90 according to one or more examples may physically connect the display driving chip 30, cut by a sawing process, to bonding pads 11, 12 or leads 11, 12 of a flexible substrate 10. In such a compressing process, an anisotropic conductive film (ACF) 50 may be used.

In order to perform the compressing process 90 according to an example, a flexible substrate 10, including a plurality of bonding pads or leads 11 and 12, may be prepared. The connectors 45 and 47 formed on the individual semiconductor die 30 or the display driving chip 30 may be compressed to the bonding pads or leads 11 and 12, so as to be corresponded one-to-one, using an anisotropic conductive film (ACF) including conductive balls 55 having a first size. The size of the conductive balls may become smaller than the original size 55 by the compressing process.

Bonding pads 11, 12 may be made of a copper (Cu) component, such that the connectors 45, 47 may also be composed of a plurality of bumps such that the connectors 45, 47 may be connected one-to-one with the bonding pads 11, 12. The inside of the ACF conductive balls 55 may be formed of nickel (Ni) plated particles, and the outside may have an insulating coated form. The ACF conductive balls 55 may serve to electrically connect the connectors 45 and 47 of the display driving chip 30 and the flexible substrate 10.

As illustrated in FIG. 3B, the ACF conductive balls 55 may exist between the connectors 45, 47 and the bonding pads 11, 12 of the flexible substrate 10 as a part of the compressing process 90. Some ACF conductive balls 55 may move in both directions in the ACF film 50.

As described above, the Chip-On-Plastic or Chip-On-Panel (COP) packaging method of the one or more examples may include preparing a Chip-On-Plastic or Chip-On-Panel (COP) packaging, preparing a display driving chip including a bump, preparing a flexible substrate including a bonding pad, attaching an anisotropic conductive film (ACF) including conductive balls to the flexible substrate, attaching the bump of the driving chip and the bonding pad of the flexible substrate to each other using the anisotropic conductive film, wherein an organic light emission display panel (OLED) is included on the flexible substrate.

Preparing the display driving chip including the bump may include preparing a plurality of display driving devices on a wafer, laser grooving the wafer and removing residues generated by the laser grooving with a plasma etching process. Such preparing is described in greater detail with respect to the drawings.

Figure 4:
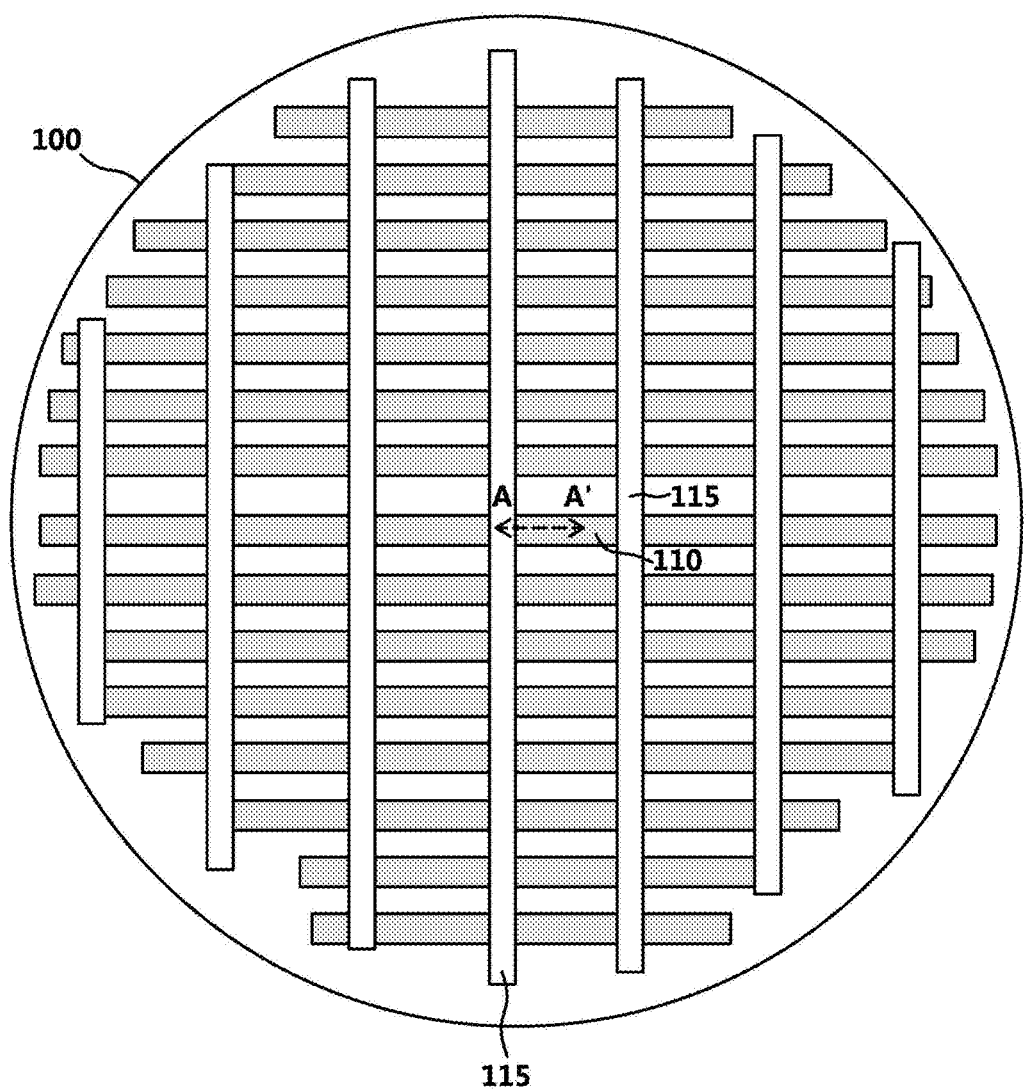
FIG. 4 illustrates a wafer in which a plurality of semiconductor dies is embedded, according to one or more examples.

FIG. 4 illustrates a wafer in which display driver devices are embedded, according to one or more examples.

Semiconductor die regions 110 may be formed in the wafer 100. In such an example, the wafer 100 may be composed of a Silicon (Si) substrate, a Silicon On Insulator (SOI) substrate, a Silicon Germanium (SiGe) substrate, or a Silicon Carbide (SiC) substrate. Also, display driving chips 30 or semiconductor dies may be produced from the semiconductor die regions 110. The display driving chip 30 may be formed through performing hundreds of processes. In addition, a scribe line 115 or a street 115 may exist between the pluralities of semiconductor die regions 110. Test patterns for testing the electrical characteristics of the display driving chip 30 formed from the semiconductor die region 110 may be located in the scribe line 115, accordingly. In addition, a Test Element Group (TEG) for measuring the thickness of the film or critical dimension (CD) in a manufacturing process operation may be formed. Alternatively, an align mark for aligning the photo mask may be formed. When the manufacturing process or testing is completed, a scribe line 115 or a street 115 may then be cut, in order to form a display driver semiconductor die or chip. As part of the cutting process, a laser cutting process or a grooving process or a diamond blade sawing process may be performed. In the present one or more examples, the laser grooving, the plasma etching, and the diamond blade sawing process may be performed sequentially as a part of the cutting process.

Figure 5:
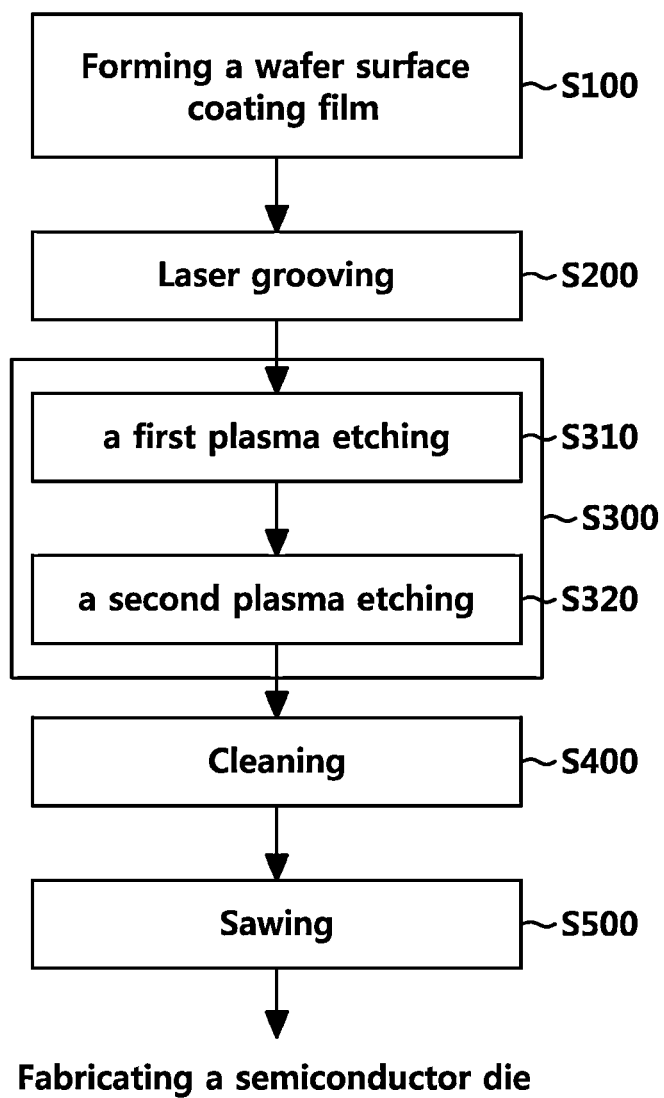
FIG. 5 is a process flowchart of a chip-on-plastic packaging method including the display driving chip, according to one or more examples.

FIG. 5 is a process flowchart illustrating a chip-on-plastic packaging method including the display driving chip, according to one or more examples.

As illustrated, a process of operation S100 of forming a coating film on the entire surface of the wafer 100, a process of laser grooving the wafer of operation S200, a process of plasma etching the wafer of operation S300, a cleaning process of removing the coating film of operation S400, and a sawing process of cutting the semiconductor substrate to form an individual semiconductor die of operation S500.

Here, the plasma etching process 170 may be divided into a first plasma etching operation S310 and a second plasma etching operation S320. The first plasma etching operation and the second plasma etching operation may be referred to as operations of removing residues or of removing by-products generated from the laser grooving process, by using etching gases.

The present examples may include ways to completely remove the residues or by-products, such as silicon debris or burrs generated by such a laser processing or a laser grooving process. The process will be described in greater detail with reference to the drawings.

Figure 6:
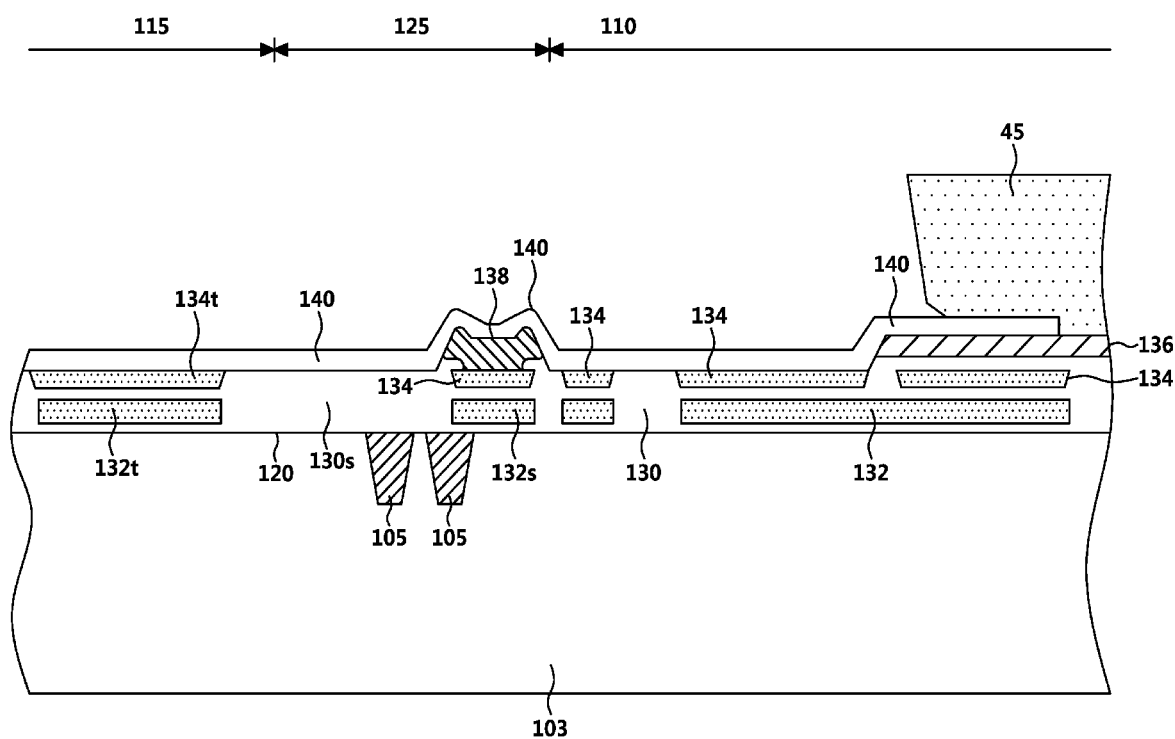
FIG. 6 is a cross-sectional view of a display driver device cut along A-A' of FIG. 4, according to one or more examples.

FIG. 6 is a cross-sectional view of the display driver device taken along A-A' of FIG. 4, according to one or more examples.

As illustrated in FIG. 6, in the fabrication method of a semiconductor die and packaging, according to one or more examples, the wafer 100 may include a semiconductor substrate 103. The semiconductor substrate 103 may include a semiconductor die region 110 and a test region 115. In addition, the semiconductor substrate 103 may further include a seal ring region 125 located between the test region and the semiconductor die region. In such an example, the test region 115 may also be referred to as a scribe line region or street. The scribe line region 115 and the test region 115 may be used together. The scribe line region or the test region 115 may be finally removed by the laser grooving and sawing process, after the test is completed. As described above, the scribe line 115 may be a region in which test patterns 132t and 134t may be formed, for testing the performance of the display driving chip 30 formed from the semiconductor die region 110. The scribe line 115 may also contain a pattern capable of measuring a residual film thickness, after the etching process or a pattern capable of measuring a pattern length or the like, or a pattern for a mask alignment. Later, the test patterns 132t, 134t or the test region 115 may be removed by the laser grooving and the diamond blade sawing process. The test patterns 132t and 134t may be formed in the same operation as the plurality of metal wires 132 and 134 formed in the die region 110.

A seal-ring region 125 may be included between the semiconductor die region 110 and the test region 115, and may surround all the devices formed in the die region 110. The interconnect metals 132s, 134, an interlayer insulating film 130s, the passivation insulating film 140 and the metal pads 128 may be formed in the seal-ring region, according to a non-limiting example. The seal-ring region 125 may be used in order to prevent cracking in the wafer otherwise caused by a dicing process. The seal-ring region 125 may serve to stop progression of the cracking, such that the semiconductor devices may be prohibited from the cracking. For this reason, a trench isolation 105 may be further used in the seal-ring region 125. The trench isolation may be formed under the interconnect metals 132s, 134 and the metal pads 128. The trench isolation may be formed in the form of a shallow trench isolation (STI) or a deep trench isolation (DTI) or a combination of such structures, such as STI and DTI, and so on.

The semiconductor die region 110 may be a region in which a display driving device for signal processing may be formed. Therefore, a gate insulating film, a gate electrode, and a source/drain region may be formed on the semiconductor substrate 103 for signal processing. Subsequently, a low dielectric constant insulating film 130, or a first interlayer insulating film, may be formed on the substrate. The low dielectric constant insulating film 130 may be required to reduce RC delay. A plurality of metal wirings 132 and 134, such as of multi-layer metal (MLM) 30 may be formed on the low-dielectric constant insulating film 130. The plurality of metal wires 132 and 134 may use copper (Cu) metal or aluminum (Al) metal, as non-limiting examples. Because the copper metal may have a smaller resistivity than the aluminum metal, one or more examples use copper metal as an example for the metal wires. Also, a metal pad 136 may be formed on the plurality of metal wires 132 and 134. The metal pad 136 may use aluminum (Al) metal, having a different material from the metal wiring, according to a non-limiting example.

The passivation insulating film 140 may be formed on the interlayer insulating film 130 and the metal pads 136 and 138. The passivation insulating film 140 may be used in order to protect the device from external moisture. The passivation insulating film 140 may also be used required in order to alleviate the impact when bump bonding or wire bonding to a metal pad. The passivation insulating film 140 may be formed by successively depositing a silicon oxide film and a silicon nitride film. That is, the passivation insulating film 140 may be a double film of a silicon oxide film and a silicon nitride film, as a non-limiting example. Alternatively, a single film of a silicon nitride film may be used, as another non-limiting example. The passivation insulating film 140 may be formed not only in the die region and the seal-ring region, but may also extend into the test region 115.

Additionally, the metal connector 45 connected to the metal pad 136 may be formed in such an example. The connector or bump 45 may be formed using gold (Au) bump material or a similar material, according to a non-limiting example. Thus, the display driving device according to the example of the present one or more examples may be formed of an low dielectric constant interlayer insulating film, a metal wiring, and a metal pad. In such an example, the connector 45 of the display driving chip 30 may be electrically connected to the bonding pad 11 of the flexible substrate 10, such that a signal may be transmitted to the display panel 20. A connector 45 that serves as a passage for output of the display driving chip 30 may also be present. Such a connector 45 may be formed by using a ball, instead of a bump.

Figure 7:
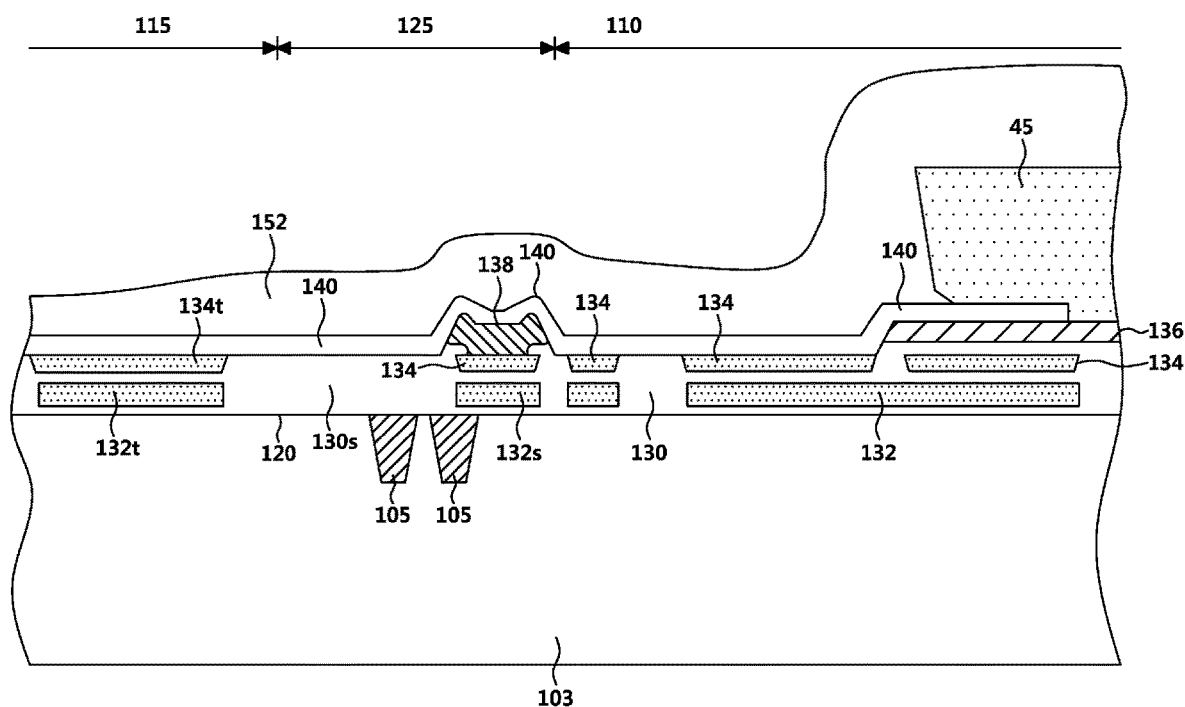
FIG. 7 is a cross-sectional view of a coating film deposited on a display driver device, according to one or more examples.

FIG. 7 is a cross-sectional view of a coating film deposited on a display driver device, according to one or more examples.

The coating film 152 may be deposited to cover all of the semiconductor die region 110, the seal-ring region 125 and the test region 115, as shown in the example of FIG. 7. The coating film 152 may be covered so as to protect the connector 45 as well as the device area in die region 110 during the subsequent plasma etching process. During the wafer sawing process, a coating film 152 may be coated on the upper surface of the semiconductor substrate 103, so as to easily remove the silicon residue generated during the laser grooving process 160. Therefore, the coating film 152 may be regarded as a kind of protective film 152, in such an example. The coating film 152 may use a material that is easily removed by an aqueous solution. In addition, the coating film 152 may protect the semiconductor die during plasma etching performed during a subsequent process. In addition, using such an approach may prohibit debris 162 or a grooving burr 161 generated during the laser cutting or grooving process from being attached to the surface of the semiconductor substrate 103, which might otherwise lead to detrimental aspects.

Figure 8:
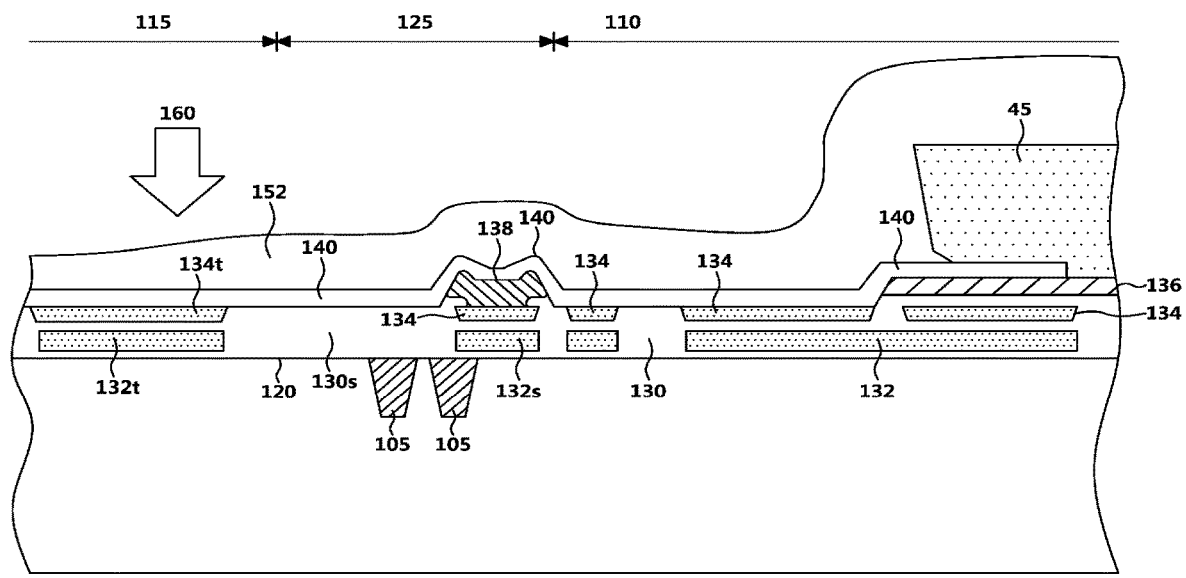
FIG. 8 illustrates a laser grooving process for forming a display driving chip, according to one or more examples.

FIG. 8 illustrates a laser grooving process for forming a display driving chip, according to one or more examples.

Laser cutting or grooving may be performed on the test region 115, using a laser source. The laser grooving process 160 may be performed in a state where the coating film 152 exists. Various residues, by-products and the like may be generated by the laser grooving process 160, such as burrs 161 or debris 162.

Figure 9:
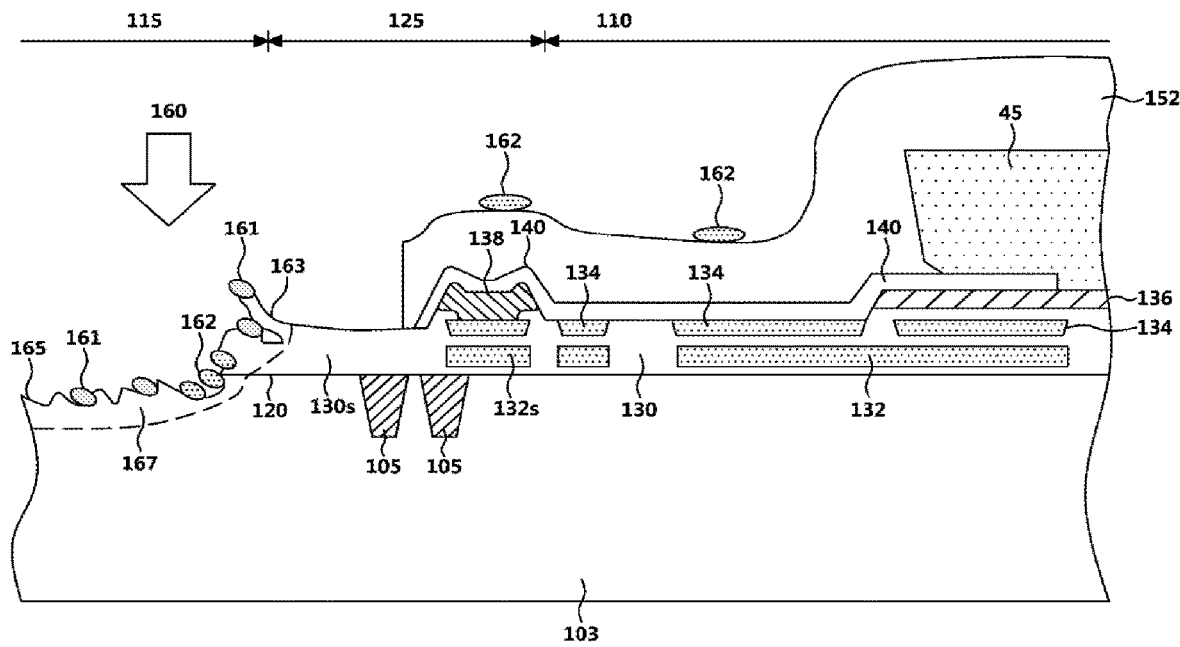
FIG. 9 is a view illustrating after a laser grooving process for forming a display driving chip, according to one or more examples.

FIG. 9 illustrates after the laser grooving process for forming a display driving device, according to one or more examples.

According to the laser grooving process 160, the passivation insulating film 140, the interlayer insulating film 130s, the substrate 103 and the test patterns 132t and 134t of the metal component may be removed. Thus, the grooved interlayer insulating film 130s and the grooved substrate 103 may be formed in the seal-ring region 125 and scribe line 115. Various residues or byproducts, such as a grooving burr 161 or a debris 162, may also be generated by the laser grooving process 160, as explained above. In such an example, the grooving burr 161 may be a residue generated by melting of the semiconductor substrate 103, the interlayer insulating film 130, and the metal wirings 132t and 134t due to heat generated by the laser grooving process 160. For example, the byproducts may include silicon atoms, metal components, and so on. The byproduct silicon atoms may be generated from a semiconductor substrate, silicon oxide films or silicon nitride films, or an interlayer insulating film, for example. Such metal components may be generated from copper metal or aluminum metal wiring and metal pads, according to non-limiting examples, as discussed, above. The silicon atoms and metal components may be melted together by a laser light source, resulting in the formation of the byproducts. Debris may refer to a kind of particles or fragments generated from the cutting process, such as the grooving process 160. In addition, delamination or film peeling phenomena 163 of the interlayer insulating film 130s may occur due to the use of a laser light source having a high thermal energy. For example, a delamination or film peeling phenomena may be caused by the high thermal energy induced by the laser light source. The bonding strength between the metal patterns 132t, 134t and the interlayer insulating films 130s and 130 may be decreased during the laser grooving process, as an effect of the laser grooving process. In addition, the interlayer insulating film 130s may be removed by the laser grooving process 160, such that the surface 120 of the semiconductor substrate 103 may be exposed. A rough surface 165 of the semiconductor substrate may also be generated after the laser grooving process 160. Furthermore, a damaged area 167 may be formed below the rough surface 165, due to a high thermal energy generated from the laser grooving process 160. In the damaged area 167, bond strengths between silicon atoms constituting the semiconductor substrate 103 may be very weak. A damaged area 167 may also exist in the interlayer insulating film 130s. Thus, cracks may be easily generated through the damaged area 167 located in the semiconductor substrate or the interlayer insulating film, when the subsequent diamond blade sawing 180 is performed. Thereby, the cracks may cause defects in the semiconductor device, and such cracks may induce failure during the subsequent packaging process.

As illustrated in FIG. 9, a grooving burr 161, which is a residue of a laser grooving, may be combined with an interlayer insulating film 130s, in which a delamination occurs. Therefore, the grooving burr 161 may also be attached to the end of the interlayer insulating film 130s. Debris 162 may be located on the rough surface 165 of the etched semiconductor substrate, or may also be located upon the top surface of the coating film 152.

The grooving burr 161 or silicon debris 162 may cause an electrical shorting by operating along with a flexible substrate equipped with a display panel, thereby causing product defects. Therefore, in order to lower the defect rate of the product, it is preferable to remove the grooving burr 161 or silicon debris 162. In such an example, the debris 162 dropped on the upper surface of the coating film 152 may be removed simultaneously while also removing the coating film 152. However, it may not be easy to remove the grooving burr 161 and the debris 162 attached on the top surface of the delaminated interlayer insulating film 163 or attached on the rough surface 165 of the etched semiconductor substrate.

In one or more examples, by performing a plasma etching process, the grooving burr 161 or the debris 162 as well as the delaminated interlayer insulating film 163 may be removed. Also, the damaged area 167 may be removed by performing the plasma etching process 170.

Figure 10:
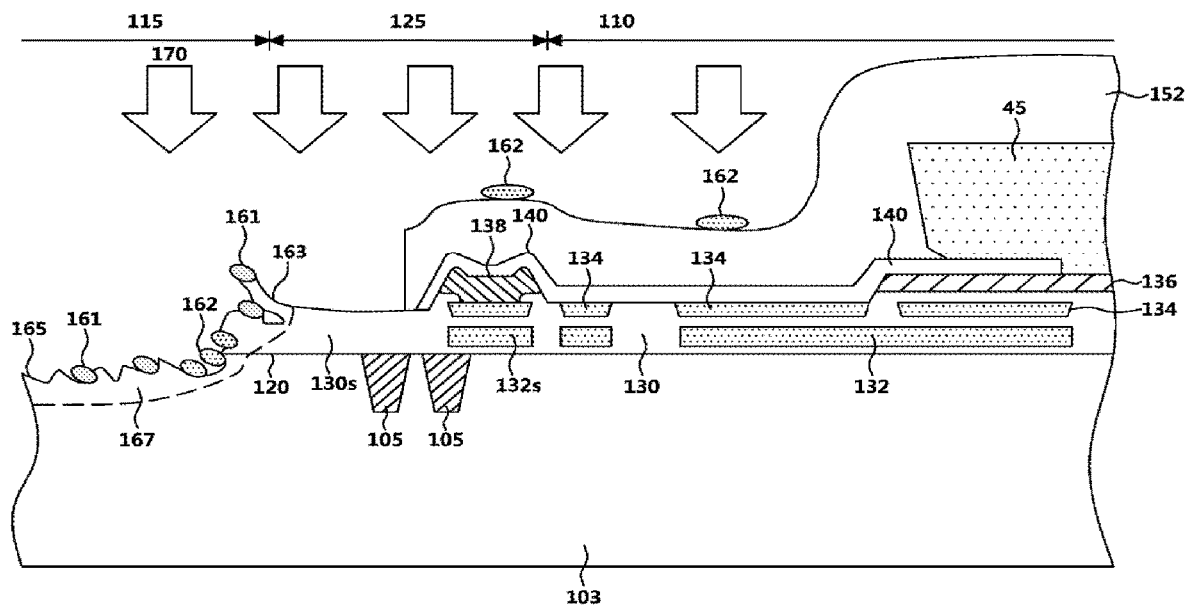
FIG. 10 illustrates a plasma etching process for forming a display driving chip, according to one or more examples.

FIG. 10 illustrates a plasma etching process for forming a display driving chip, according to one or more examples.

The plasma etching process 170 may be performed to remove residues or by products generated by a laser cutting or a grooving process, such as a grooving burr 161, silicon debris 162, a delaminated interlayer insulating film 163, a rough surface 165 of the etched semiconductor substrate and the damaged areas 167 formed on the lower portion.

The plasma etching process 170 may be applied to the grooved interlayer insulating film 130s and the grooved substrate 103 in the seal-ring region 125 and the scribe line or test region 115. Thus, the grooved interlayer insulating film 130s and the grooved substrate 103 may turn into the plasma etched interlayer insulating film 130s and the plasma etched substrate 103 by performing the plasma etching process 170. A depth of the plasma etched interlayer insulating film 130s may be lower than a depth of the grooved interlayer insulating film 130s. The plasma etched substrate 103 may also have a depth lower than a depth of the grooved substrate 103.

In the present examples, the plasma etching process 170 may proceed with the first plasma etching operation S310 and the second plasma etching operation S320, which is the main operation. The first plasma etching operation S310 and the second plasma etching operation S320 may be different in the type of gas used.

The first plasma etching operation S310 may perform injection of combined oxygen ($O_2$) and nitrogen ($N_2$) plasma gas. Instead of the nitrogen gas, Argon (Ar) or Helium (He) gas in a plasma state may also be used. Oxygen plasma gas may oxidize the grooving burr 161, the debris 162 and the rough surface 165 of the semiconductor substrate, resulting in transformation of the oxidized burr, the oxidized debris and the oxidized surface of the semiconductor substrate, respectively.

The second plasma etching operation, containing the fluorine (F) gas, may remove the oxidized residues, such as the oxidized grooving burr 161, the oxidized debris 162 and the oxidized surface 165. The delaminated interlayer insulating film 163 and the damaged area 167 may also be removed by the second plasma etching process. For example, Carbon Tetrafluoride ($CF_4$), Sulfur Hexafluoride ($SF_6$), Octafluorocyclobutane ($C_4F_8$), Fluoromethane ($CH_3F$), Nitrogen trifluoride ($NF_3$), and so on, may be used for the second plasma etching process, as non-limiting examples.

The process conditions such as pressure, plasma power, etching time, and so on, regarding the second plasma etching process, are shown in Table 1 below:

TABLE 1

| | $CF_4$ [sccm] | $O_2$ [sccm] | $N_2$ [sccm] | Pressure [mTorr] | Power [W] | Time [sec] |
|---|---|---|---|---|---|---|
| 1st operation (S310) | | 5~10000 | 5~50000 | 5~700 | 10~10000 | 10~2000 |
| 2nd operation (S320) | 5~10000 | 5~50000 | | 5~700 | 10~10000 | 10~4000 |

Figure 11:
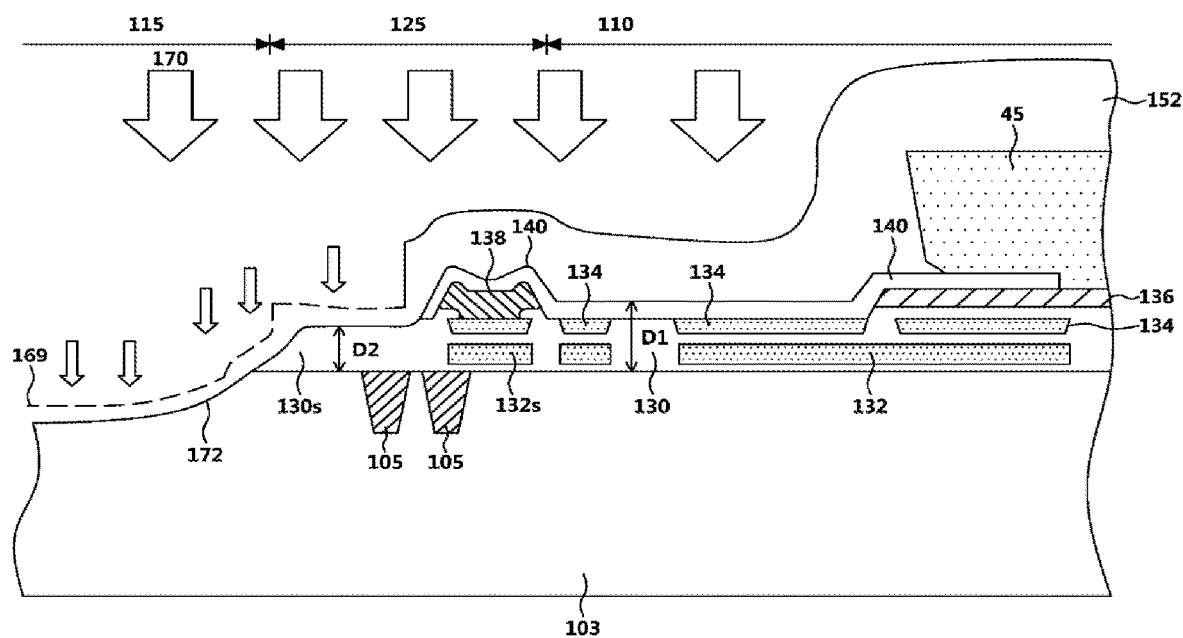
FIG. 11 illustrates results after a plasma etching process for forming a display driving chip, according to one or more examples.

FIG. 11 illustrates results after a plasma etching process for forming a display driving chip, according to one or more examples.

During the plasma etching process 170, the interlayer insulating film 130s may be partially etched in the seal-ring region 125, and the semiconductor substrate 103 damaged by the laser grooving process 160 may also be removed. The areas 167 damaged by the laser grooving process indicated by the dotted line 169 may all be removed in order to form a new etched surface 172. Because of the plasma etching process 170, the interlayer insulating film 130s in the seal-ring region 125 may have a thickness D2 that is less than a thickness D1 of the interlayer insulating film 130 in the semiconductor die region 110. The interlayer insulating film 130 of the semiconductor die region 110 may not be etched because it is protected by the coating film 152. In a similar way, a thickness of the semiconductor substrate 103 in the test region 115 may become smaller than a thickness of the semiconductor substrate 103 of the semiconductor die region 110, because the damaged area 167 of the test region 115 may also be removed.

During the laser grooving process described above, various cracks may be generated in the damaged area 167. However, when the plasma etching process is performed, the damaged area 167 may be removed such that the strength of the semiconductor substrate 103 may be improved. In addition, the rough surface 165 of the substrate may become a very smooth curved surface 172 by performing the plasma etching process 170. The presence of the smooth curved surface 172 may be helpful for performing the subsequent diamond blade sawing process. Even though the plasma etching process may be performed, the passivation insulating film 140 may still remain on the metal pad 138 in the seal-ring region 125, because the coating film 152 may protect the passivation insulating film 140 in the seal-ring region 125.

When the plasma etching process 170 is completed, the coating film 152 may be removed by performing a cleaning process using an aqueous solution of operation s400. Thus, the passivation insulating film 140 and the connector or Bump 45 may be exposed again. The cleaning process of operation S400 may be a process of removing the coating film 152 by using an aqueous solution such as deionized (DI) water. Even if the debris 162 remains on the coating film 152, the debris 162 may be simultaneously removed when the coating film 152 is removed by the cleaning process including the DI water.

As discussed, the grooving burr and the debris generated by a laser grooving process may be completely removed by performing a plasma etching process. Therefore, it may be possible to solve the shorting defect problem caused by the conductive grooving burr 161 and the conductive debris 162 that may otherwise remain after the laser grooving process.

Figure 12:
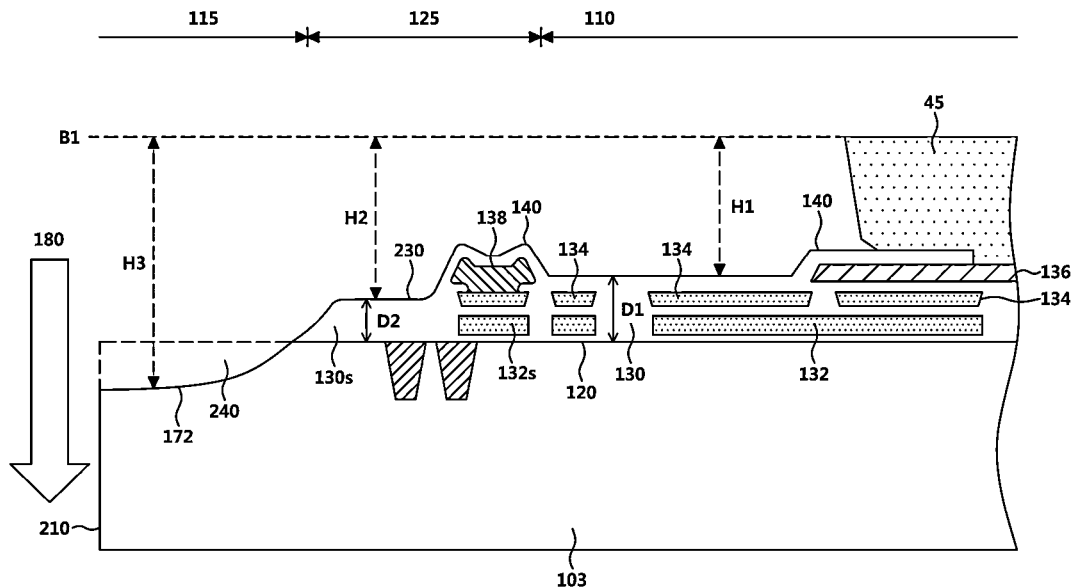
FIG. 12 illustrates a diamond blade sawing process for forming a display driving chip, according to one or more examples.

FIG. 12 illustrates a diamond blade sawing process for forming a display driving chip, according to one or more examples.

After the cleaning process is completed, a diamond blade sawing process 180 may be performed. The diamond blade sawing process 180 may be a mechanical sawing process, such as a mechanical sawing process using a diamond blade, according to a non-limiting example. Such an approach may be used to manufacture an individual semiconductor die or a display driving chip 30, using such a diamond blade sawing process. When the diamond blade sawing is completed, the side surface 210 of the semiconductor substrate 103 may be newly formed, as a result.

In such an example, H1 may be a distance between an imaginary horizontal line B1 extended from the upper surface of the connector 45 and the passivation insulating film 140 in the semiconductor die region. H2 may be a distance between the top surface 230 of the interlayer insulating film 130s of the seal-ring region 125 and the imaginary horizontal line B1. The interlayer insulating film 130s of the seal-ring region 125 may be etched by a laser and plasma etching process, such that a value of H2 is greater than a value of H1. Also, in the test region, H3 may be a distance between the etched surface 172 and the imaginary horizontal line B1. The etched surface 172 may be greatly lowered with respect to the original top surface 120, because a portion 240 of the semiconductor substrate 102 may be removed by a laser and plasma etching process. Therefore, H3 may have a greater distance or height than that of H2.

Figure 13:
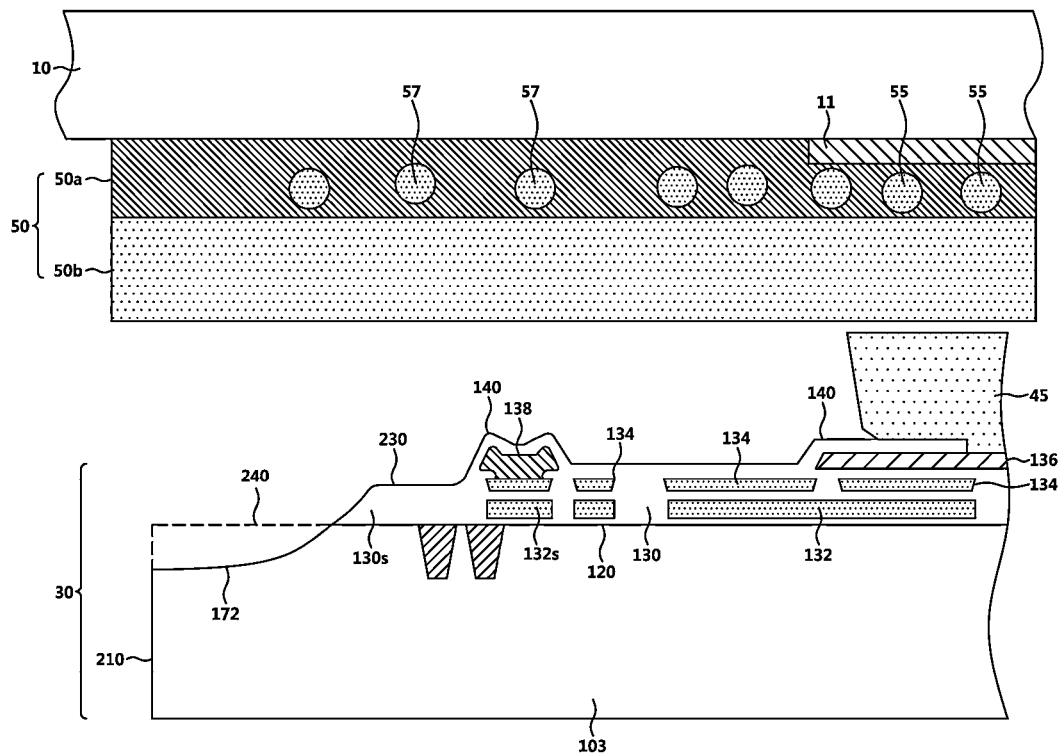
FIG. 13 is a view illustrating an anisotropic conductive film (ACF) attached to a substrate of a display panel, according to one or more examples.

FIG. 13 illustrates an anisotropic conductive film (ACF) attached to a substrate of a display panel, according to one or more examples.

As illustrated in FIG. 13, a flexible substrate, including a bonding pad 11, may be prepared. The flexible substrate 10 may include a material having flexible characteristics, such as polyimide (PI). A display panel 20 may be formed on the flexible substrate 10, as shown in FIG. 1. In the example of FIG. 13, the display panel 20 may be any one of various display panels, including an LCD panel and an OLED panel and the like, as non-limiting examples. A touch sensor and the like may be further disposed on the display panel, in a non-limiting example.

An anisotropic conductive film ACF 50 may be attached onto a flexible substrate 10 having a bonding pad 11. The ACF 50 may include a plurality of conductive balls 55 and 57. The conductive balls 55 may serve to electrically connect the connector 45 of the display driving chip 30 and the bonding pad 11 of the flexible substrate 10. In such an example, the ACF 50 may include two layers 50a and 50b. The first layer 50a may be a conductive film, including conductive balls 55 and 57, and the second layer 50b may be a non-conductive film NCF 50b that is formed on the first layer. The second layer 50b, serving as an insulating film, may be located between the first layer 50a and the individual semiconductor die 30, such that between the flexible substrate 10 and the semiconductor die 30 may be insulated from one another.

Figure 14:
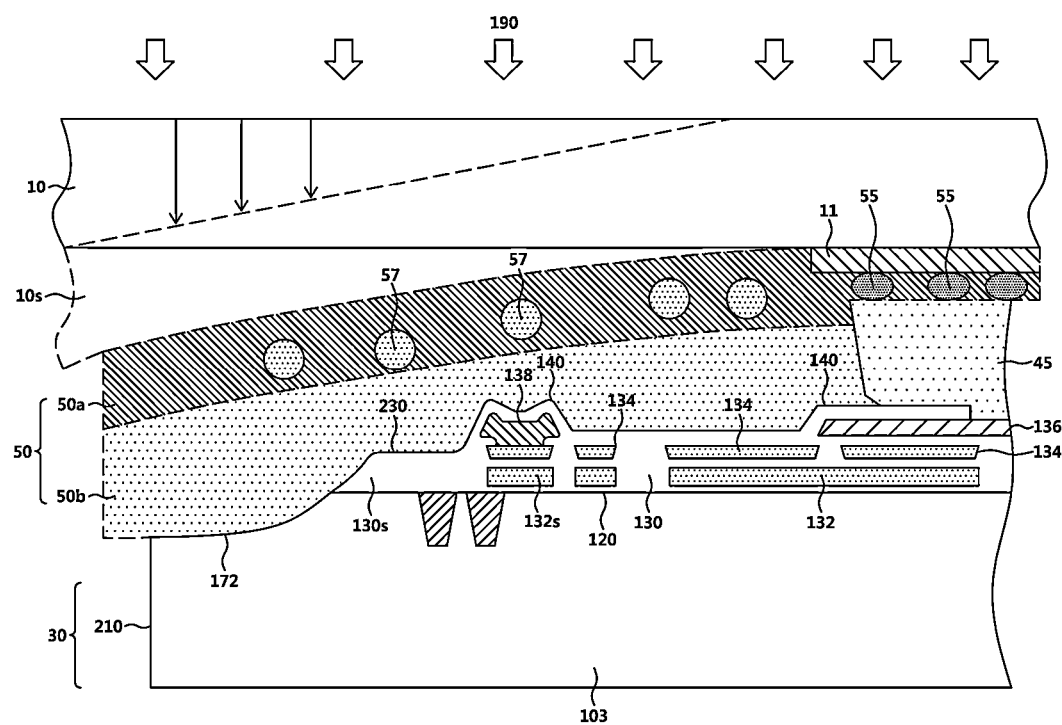
FIG. 14 is a cross-sectional view after a chip-on-plastic (COP) packaging process for connecting a display driving chip and a display panel substrate, according to one or more examples.

FIG. 14 is a cross-sectional view of after a chip-on-plastic (COP) packaging process for connecting a display driving chip and a display panel substrate, according to one or more examples.

The chip-on-plastic (COP) packaging process or the compressing process 190, according to an example of the present examples, connects the display driving chip 30 with a bonding pad or lead 11 on a flexible substrate 10. In such an example, the display driving chip 30 may refer to a chip cut by a wafer sawing process, such as laser grooving and diamond blade sawing according to a non-limiting example.

As illustrated in FIG. 14, the conductive balls 55 may be used for bonding the bump 45 and the bonding pad 11 of the flexible substrate 10 in order to form an electrical path. However, the conductive balls 57 that do not participate in the electrical paths may move out from the bonding pad 11 and the connector 45 during the compressing process 190.

During the compressing process 190, because the flexible substrate 10 is more flexible than a rigid substrate, the flexible substrate 10 may be bent in one direction to a greater extent than a rigid substrate would be. The non-conductive film 50b of the ACF 50 may be in contact with the passivation insulating film 140 of the semiconductor die 30 and may be in contact with the interlayer insulating film 130s of the seal-ring region 125. Because of the bending phenomenon of the flexible substrate 10, the distance between the bended flexible substrate 10s and the individual semiconductor die 30 may be further narrowed, as illustrated in FIG. 14. Even if the distance is narrowed in this manner, because an insulating film NCF 50b exists, the regions between the flexible substrate 10 and the semiconductor die 30 may be insulated from one another. Also, as described above, because all of the grooving burrs may be removed, a sufficient distance between the semiconductor die 30 and the flexible substrate 10 may be maintained, as well. Such grooving burrs are removed by plasma etching, such that no grooving burrs formed at the ends of the individual semiconductor die 30 may remain. Therefore, the conductive balls 57 that do not participate in the electrical path may move the space between the flexible substrate 10 and the individual semiconductor die 30 by using a pressing panel process that may proceed at a high temperature. If the grooving burr remains in the edge part, that is, near the edge, of the individual semiconductor die 30, the grooving burr may be in contact with the conductive balls 57 in the non-conductive film 50b of the ACF 50 to. In such an example, there may be a problem that a shorting phenomenon may be caused. Thus, the grooving burr is to be removed by a plasma etching process, such that neither a groove burr nor debris remains on top of the semiconductor die.

In FIG. 14, the semiconductor die packaging is completed and the individual semiconductor die 30 may have the following structure. A semiconductor substrate 103 may include a semiconductor die region 110 and a seal-ring region 125, interlayer insulating films 130 and 130s formed on the semiconductor substrate 103, metal wirings 132, 132s, 134 and metal pads 136, 138, and a passivation insulating film 140 formed on the metal pads 136, 138 and a connector 45 connected to the metal pad 136. In such an example, the thickness of the interlayer insulating film 130s of the seal-ring region 125 may be smaller than the thickness of the interlayer insulating film 130 of the semiconductor die region 110, as formed by the laser grooving process and the plasma etching process. In such an example, the connector 45 may be a metal bump 45 that may be made of a material such as gold (Au), where the metal pad 136 may include aluminum (Al) metal, the passivation insulating film 140 may include a silicon nitride film, the metal wirings 132, 132s, and 134 may include copper (Cu) metal, and the interlayer insulating films 130 and 130s may be low dielectric constant insulating films, wherein the dielectric constant, k, may be less than 3.

Also, the individual semiconductor die 30 may further include a conductive film 50a, including the conductive balls 55 disposed on the connector 45 and the flexible substrate 10 attached to the conductive film 50a. The flexible substrate 10 may be curved toward the seal-ring region 125, by performing a compressing process. In addition, the flexible substrate 10 may include a bonding pad 11 connected to the conductive balls 55. Between the connector 45 of the semiconductor die 30 and the bonding pad 11 of the flexible substrate 10 may be a connection formed by the conductive balls 55. The anisotropic conductive film 50 may be further included between the flexible substrate 10 and the semiconductor die 30, and the anisotropic conductive film 50 may include a conductive film 50a and may include a non-conductive film 50b. The non-conductive film 50b may be between the semiconductor die 30 and the conductive film 50a.

According to the proposed fabrication method of a semiconductor die such as display driving chip of the present disclosure, a semiconductor die may be formed by performing the first plasma etching and the second plasma etching, in consecutive order after the laser grooving process.

By performing the proposed plasma etching process, a grooving burr fused on an interlayer insulating film may be removed during a laser grooving process, which may be a previous process. Also, a silicon debris formed on the coating film may be removed by a cleaning process, which may be a subsequent process.

As a result, it may be possible to remove all of the silicon debris generated by the laser grooving process, such that there is an effect of preventing the electrical shorting phenomenon otherwise caused by the silicon debris that would be located between the display panel substrate and the semiconductor die. Also, this effect may have an advantageous effect in that it may substantially reduce the defective rate of the packaging process.

In addition, the present examples may have an effect of simultaneously removing cracks generated in the interlayer insulating film or wafer of the semiconductor die by laser grooving, thereby increasing the strength of the wafer in order to improve product performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor die, comprising:
   a semiconductor substrate comprising a semiconductor die region and a seal-ring region;
   an interlayer insulating film, a metal wiring, and a metal pad formed on the semiconductor substrate;
   a passivation insulating film formed on the metal pad;
   a metal bump connected to the metal pad;
   an anisotropic conductive film (ACF) comprising conductive balls and formed on the semiconductor die; and
   a flexible substrate attached to the ACF and curved toward the seal-ring region of the semiconductor die,
   wherein a thickness of the interlayer insulating film disposed in the seal-ring region is smaller than a thickness of the interlayer insulating film disposed in the semiconductor die region.

2. The semiconductor die of claim 1, wherein the ACF comprises a conductive layer and a non-conductive layer, and
   wherein the non-conductive layer is disposed between the semiconductor die and the conductive layer.

3. The semiconductor die of claim 2, wherein the non-conductive layer in the ACF is in contact with the passivation insulating film and/or with the interlayer insulating film.

4. The semiconductor die of claim 1, wherein the flexible substrate comprises a bonding pad, and
   wherein the metal bump is connected to the bonding pad through the conductive balls in the ACF.

5. The semiconductor die of claim 1, wherein the metal pad comprises an aluminum (Al) metal,
   wherein the passivation insulating film comprises a silicon nitride (SiN) film,
   wherein the metal wiring comprises a copper (Cu) metal, and
   wherein the interlayer insulating film has a low-dielectric constant of less than 3.

6. A semiconductor die, comprising:
   a semiconductor substrate comprising a semiconductor die region and a seal-ring region;
   an interlayer insulating film, a metal wiring, and a metal pad formed on the semiconductor substrate;
   a passivation insulating film formed on the metal pad;
   a metal bump connected to the metal pad;
   an anisotropic conductive film (ACF) comprising conductive balls and configured to be attached to the semiconductor die; and
   a flexible substrate attached to the ACF and curved toward the seal-ring region of the semiconductor die.

7. The semiconductor die of claim 6, wherein a thickness of the interlayer insulating film in the seal-ring region is smaller than a thickness of the interlayer insulating film in the semiconductor die region.

8. The semiconductor die of claim 6, wherein the ACF comprises a conductive layer and a non-conductive layer, and
   wherein the non-conductive layer is disposed between the semiconductor die and the conductive layer.

9. The semiconductor die of claim 8, wherein the non-conductive layer in the ACF is in contact with the passivation insulating film and/or with the interlayer insulating film.

10. The semiconductor die of claim 6, wherein the flexible substrate comprises a bonding pad, and
   wherein the metal bump is connected to the bonding pad through the conductive balls in the ACF.

* * * * *